(12) United States Patent
Krishtab et al.

(10) Patent No.: US 11,923,198 B2
(45) Date of Patent: Mar. 5, 2024

(54) RESISTLESS PATTERNING MASK

(71) Applicants: IMEC VZW, Leuven (BE); Katholieke Universiteit Leuven, KU LEUVEN R&D, Leuven (BE)

(72) Inventors: Mikhail Krishtab, Heverlee (BE); Silvia Armini, Heverlee (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 243 days.

(21) Appl. No.: 17/228,295

(22) Filed: Apr. 12, 2021

(65) Prior Publication Data

US 2021/0375615 A1   Dec. 2, 2021

(30) Foreign Application Priority Data

Jun. 2, 2020 (EP) ..................... 20177913

(51) Int. Cl.
*H01L 21/027* (2006.01)
(52) U.S. Cl.
CPC ................. *H01L 21/0273* (2013.01)
(58) Field of Classification Search
CPC ...... H01L 21/0273; G03F 7/0042; G03F 7/11; G03F 7/165; G03F 7/265; G03F 7/0035
See application file for complete search history.

(56) References Cited

U.S. PATENT DOCUMENTS

| | | |
|---|---|---|
| 5,079,600 A | 1/1992 | Schnur et al. |
| 9,165,588 B2 * | 10/2015 | Kimura ................. G11B 5/855 |
| 9,570,302 B1 | 2/2017 | Chang et al. |
| 9,612,522 B2 | 4/2017 | Hassan et al. |
| 10,529,584 B2 | 1/2020 | Tapily |

(Continued)

FOREIGN PATENT DOCUMENTS

| | | |
|---|---|---|
| CN | 110058344 A | 7/2019 |
| TW | 201807495 A | 3/2018 |

(Continued)

OTHER PUBLICATIONS

Extended European Search Report and Written Opinion, European Application No. 20177913.9, dated Dec. 11, 220, 6 pages.

(Continued)

*Primary Examiner* — John P. Dulka
(74) *Attorney, Agent, or Firm* — McDonnell Boehnen Hulbert & Berghoff LLP

(57) ABSTRACT

In a first aspect, the present disclosure relates to a method for forming a patterning mask over a layer to be patterned, the method comprising: (a) providing a first layer over a substrate, the substrate comprising the layer to be patterned, the first layer being capable to bond with a monolayer comprising a compound comprising a functional group for bonding to the first layer and a removable organic group, (b) bonding the monolayer to the first layer, (c) exposing the monolayer to an energy beam, thereby forming a pattern comprising a first area comprising the compound with the removable organic group and a second area comprising the compound not having the removable organic group, and (d) selectively depositing an amorphous carbon layer on top of the first area.

13 Claims, 2 Drawing Sheets

(56) References Cited

U.S. PATENT DOCUMENTS

| | | | |
|---|---|---|---|
| 2008/0213702 A1* | 9/2008 | Bae | H10K 71/60 |
| | | | 430/315 |
| 2012/0238109 A1* | 9/2012 | Hattori | G03F 7/265 |
| | | | 257/E21.259 |
| 2015/0042944 A1 | 2/2015 | Hatanaka et al. | |
| 2017/0052447 A1* | 2/2017 | Yamada | G03F 7/7035 |
| 2018/0151345 A1 | 5/2018 | Haukka et al. | |
| 2018/0240667 A1 | 8/2018 | Yu et al. | |
| 2019/0137879 A1 | 5/2019 | Han et al. | |
| 2019/0322812 A1 | 10/2019 | Wojtecki et al. | |
| 2019/0391494 A1 | 12/2019 | Wojtecki et al. | |

FOREIGN PATENT DOCUMENTS

| | | |
|---|---|---|
| TW | 201842573 A | 12/2018 |
| WO | 2017/066319 A2 | 4/2017 |
| WO | 2019147312 A1 | 8/2019 |
| WO | 2019217749 A1 | 11/2019 |
| WO | 2020102085 A1 | 5/2020 |

OTHER PUBLICATIONS

Naydenova, Katerina, Mathew J. Peet, and Christopher J. Russo. "Multifunctional graphene supports for electron cryomicroscopy." Proceedings of the National Academy of Sciences 116, No. 24 (2019): 11718-11724.

Turchanin, Andrey, Mark Schnietz, Mohamed El-Desawy, Harun H. Solak, Christian David, and Armin Golzhauser. "Fabrication of Molecular Nanotemplates in Self-Assembled Monolayers by Extreme-Ultraviolet-Induced Chemical Lithography." Small 3, No. 12 (2007): 2114-2119.

Liu, Tzu-Ling, and Stacey F. Bent. "Area-selective atomic layer deposition of dielectric-on-dielectric for Cu/low-k dielectric patterns." In Advances in Patterning Materials and Processes XXXVI, vol. 10960, p. 109600O. International Society for Optics and Photonics, 2019.

Lee, Wonyoung, and Fritz B. Prinz. "Area-selective atomic layer deposition using self-assembled monolayer and scanning probe lithography." Journal of the Electrochemical Society 156, No. 9 (2009): G125.

De Silva, Anuja, Karen Petrillo, Luciana Meli, Jeffrey C. Shearer, Genevieve Beique, Lei Sun, Indira Seshadri et al. "Single-expose patterning development for EUV lithography." In Extreme Ultraviolet (EUV) Lithography VIII, vol. 10143, p. 101431G. International Society for Optics and Photonics, 2017.

Zhang, Zizhuo, Tobias Dwyer, Stephen M. Sirard, and John G. Ekerdt. "Area-selective atomic layer deposition of cobalt oxide to generate patterned cobalt films." Journal of Vacuum Science & Technology A: Vacuum, Surfaces, and Films 37, No. 2 (2019): 020905.

* cited by examiner

RESISTLESS PATTERNING MASK

CROSS-REFERENCE TO RELATED APPLICATIONS

The present application is a non-provisional patent application claiming priority to European Patent Application No. 20177913.9, filed on Jun. 2, 2020, the contents of which are hereby incorporated by reference.

FIELD OF THE DISCLOSURE

The present disclosure relates to lithography. More particularly, the present disclosure relates to resistless lithography.

BACKGROUND

The fabrication of a semiconductor device typically involves multiple lithography steps that define the geometry and functionality of the device. Driven by the demand for downscaling of the device dimensions, the wavelength of light employed in advanced optical lithography has shortened as well until it eventually reached the extreme ultraviolet (EUV) range in commercial scanners. Alongside the development of high-power EUV light sources, the finding of an optimal resist material is a key issue for EUV lithography. The latter is particularly challenging as at the energy of an EUV photon (92.5 eV, or equivalently a wavelength of about 13.5 nm) the mechanism of light-resist interaction changes from photochemistry to radiation chemistry. Furthermore, very thin resist films are required for patterning dimensions below 10 nm. Therefore, it is very difficult to control resist composition and uniformity which results in high line edge roughness and lack of pattern control. In addition, even more challenges exist when resists are used, the challenges comprising stochastics, contamination of Bragg mirrors, and RLS trade-off, which is the trade-off between resolution, line-width roughness, and sensitivity. Moreover, EUV lithography with resists requires complex and costly development of the resist materials and their processing, while the resist acts exclusively as a sacrificial material removed soon after the transfer of the pattern into a more robust hard-mask layer.

Recent advances in area-selective deposition (ASD) by atomic layer deposition (ALD) processes allow the development of EUV lithography without using EUV resists. As an example, US20190391494 discloses a patterning method using EUV radiation, wherein a self-assembled monolayer (SAM) formed with hydroxamic acid compounds is deposited on a top surface of a substrate, the substrate comprising e.g. a dielectric material. Regions of the SAM are exposed to EUV. Afterward, ALD material such as zinc oxide is deposited substantially or exclusively on either the exposed region or the non-exposed region to form a patterned ALD film. The thus formed patterned ALD film can serve as a mask for an etch process.

There is a lack however of resistless patterning masks with a high sensitivity to EUV. At present, high doses of EUV radiation are required for the patterning, thereby reducing the throughput of the lithography process. Moreover, methods according to the state-of-the-art do not allow for both positive and negative toning. Finally, in general, methods according to the state-of-the-art still require the employment of expensive materials and non-standard deposition steps, or materials that are not generally available in semiconductor fabrication, and cannot be easily introduced therein.

Hence, there is still a need in the art for methods overcoming one or more of the above-stated problems.

SUMMARY

It is a potential benefit of the present disclosure to provide methods of forming a patterning mask over a layer to be patterned. It is a further potential benefit of the present disclosure to provide structures associated therewith.

Some embodiments of the present disclosure do not involve resist in the lithography process, rather they rely on the EUV sensitivity of the surface. Embodiments of the present disclosure involve a patterning mask that can be formed without using a photoresist (i.e. such that it can be used in a resistless lithography), thereby reducing the complexity of the patterning mask. Embodiments of the present disclosure can obviate the need to find an optimal photoresist material. It is yet a further potential benefit that circumventing the photoresist material may lower the overall production cost of the patterning mask by reducing for instance the development cost, material cost, and processing cost. It is still a further potential benefit of embodiments of the present disclosure that typical issues related to EUV resists are alleviated, such as adhesion, pattern collapse, scumming, and RLS trade-off typically observed in chemically amplified resist (CAR)-based EUV resists.

It is a potential benefit of embodiments of the present disclosure that the top surface that is exposed to an energy beam is sensitive to EUV. It is a further potential benefit of embodiments of the present disclosure that a sensitizer layer could be introduced that further increases the sensitivity of the top surface to EUV. It is a further potential benefit of embodiments of the present disclosure that by enabling a lower energy dose to be used, the throughput of the lithography can be increased.

It is a potential benefit of embodiments of the present disclosure that the patterning mask is compatible with a wide range of underlying layers to be patterned.

It is a potential benefit of embodiments of the present disclosure that the methods and materials comprised therein are already commonly used in semiconductor fabrication, or can be easily introduced therein.

It is a potential benefit of embodiments of the present disclosure that the method enables both positive and negative tone patterns.

In a first aspect, the present disclosure relates to a method for forming a patterning mask over a layer to be patterned, the method comprising: (a) providing a first layer over a substrate, the substrate comprising the layer to be patterned, the first layer being configured to bond with a monolayer comprising a compound comprising a functional group for bonding to the first layer and a removable organic group, (b) bonding the monolayer to the first layer, (c) exposing the monolayer to an energy beam, thereby forming a pattern comprising a first area comprising the compound with the removable organic group and a second area comprising the compound not having the removable organic group, and (d) selectively depositing an amorphous carbon layer on top of the first area.

In embodiments of the first aspect, the present disclosure relates to a method comprising step (e) after step (d), of replicating the pattern into any layer present between the pattern and the layer to be patterned, by etching through the layer, selectively with respect to the amorphous carbon layer.

In embodiments of the first aspect, the present disclosure relates to a method comprising steps (f), (g), and (h) after step (d), of (f) halogenating the amorphous carbon layer, thereby forming a halogenated amorphous carbon layer, (g) selectively depositing an inorganic mask layer on top of the second area, thereby forming an inorganic pattern, and (h) replicating the inorganic pattern into any layer present between the inorganic pattern and the layer to be patterned, by etching through the layer, selectively with respect to the inorganic pattern.

In a second aspect, the present disclosure relates to a method for patterning a layer, by replicating the pattern of the layer on top of the layer to be patterned into the layer to be patterned.

In a third aspect, the present disclosure relates to a structure comprising (i) a substrate comprising a layer to be patterned, (ii) a first layer over the substrate, (iii) a monolayer bonded to the first layer, the monolayer comprising a compound, the first layer comprising a pattern comprising a first and a second area, the first area comprising the compound comprising an organic group and the second area comprising the compound not comprising the organic group, and (iv) an amorphous carbon layer on top of the first area of the first layer.

Aspects of the disclosure are set out in the accompanying independent and dependent claims. Features from the dependent claims may be combined with features of the independent claims and with features of other dependent claims as appropriate and not merely as explicitly set out in the claims.

The above and other characteristics and features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
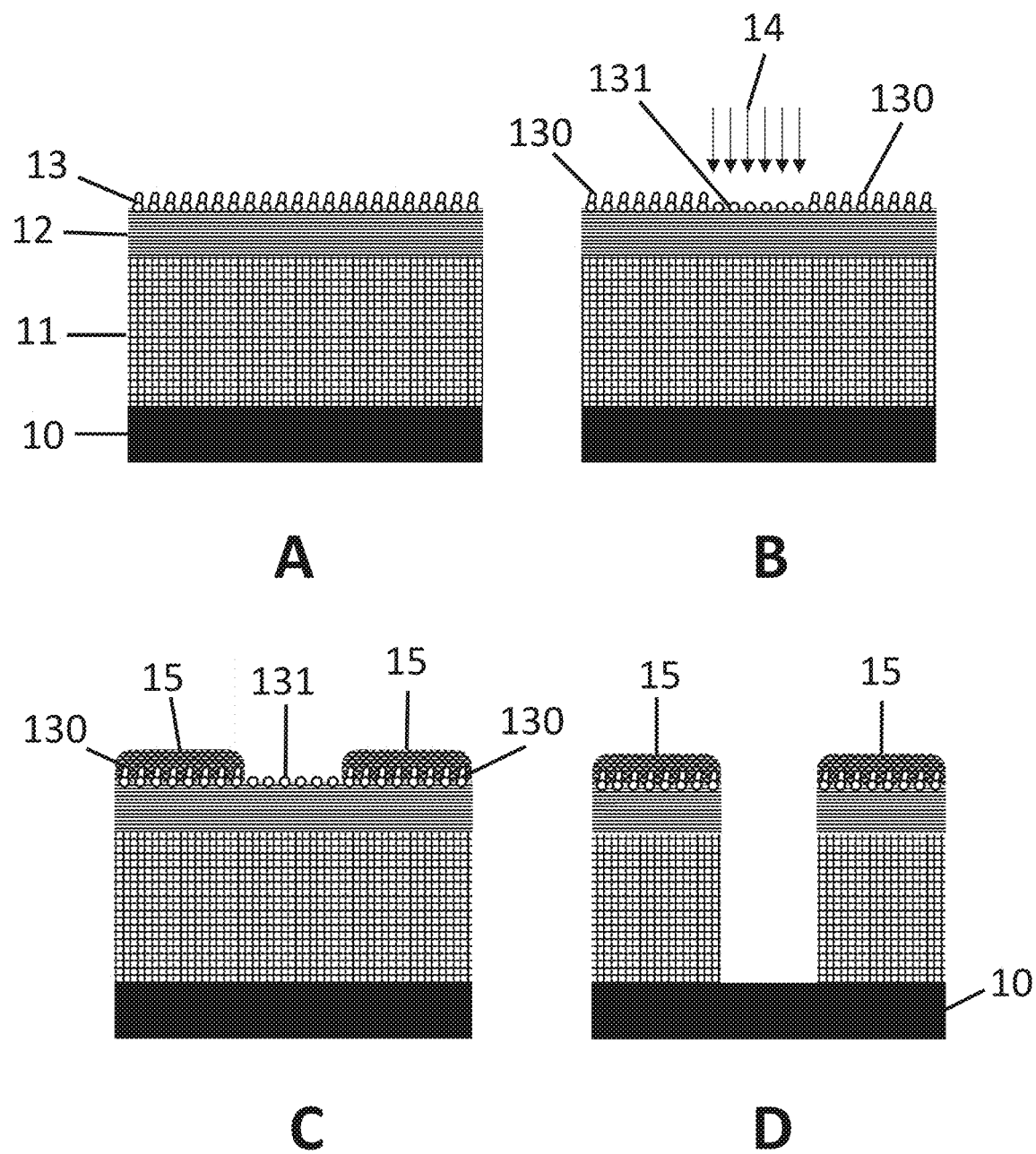
FIG. 1 is a schematic representation of steps of a method, according to an embodiment.

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

As used herein, and unless otherwise specified, when a first material is said to be etched selectively with respect to a second material, this can mean that the first material is etched faster than the second material. The etching process could etch the first material at least two times faster, at least five times faster, or at least ten times faster, than the second material. In some embodiments, the second material may be substantially un-etched by the etching process.

As used herein, and unless otherwise specified, when a material is said to be formed (e.g. grown or deposited) selectively on a second area with respect to a first area, this can mean that the material is only formed on the second area, and not on the first area. In embodiments, the material is formed faster on the second area than on the first area. In embodiments, the formation of the material on the second area is at least two times faster, at least five times faster, or at least ten times faster than on the first area. In some embodiments, the material may be substantially unformed on the first area.

In a first aspect, the present disclosure relates to a method for forming a patterning mask over a layer to be patterned, the method comprising: (a) providing a first layer over a substrate, the substrate comprising the layer to be patterned, the first layer being configured to bond with a monolayer comprising a compound comprising a functional group for bonding to the first layer and a removable organic group, (b) bonding the monolayer to the first layer, (c) exposing the monolayer to an energy beam, thereby forming a pattern comprising a first area comprising the compound with the removable organic group and a second area comprising the compound not having the removable organic group, and (d) selectively depositing an amorphous carbon layer on top of the first area.

In embodiments, forming the patterning mask over the layer to be patterned may comprise forming the patterning mask above the layer to be patterned. In embodiments, forming the patterning mask over the layer to be patterned may comprise forming the patterning mask on top of the layer to be patterned.

The layer to be patterned is not particularly limited and may generally be any layer for which a sufficient etch selectivity with respect to a mask used in this method can be achieved (i.e. so that the mask can function as a patterning mask for the layer to be patterned). In embodiments, the layer to be patterned may be an intermediate structure in the manufacture of a semiconductor device, such as a semiconductor substrate or a semiconductor structure.

The first layer provided over the substrate is selected for being configured to covalently attach to the monolayer of step (b). The first layer may for instance be deposited using one of the following techniques: atomic layer deposition, chemical vapor deposition, and physical vapor deposition. In embodiments, the first layer comprises at least one oxide, or consists of a single oxide, such as a metal oxide, typically selected from silicon oxide, tin oxide, zirconium oxide, and titanium oxide. In embodiments, the first layer has a thickness of up to 10 nm, for instance 1 nm to 10 nm.

The monolayer comprises a compound comprising a functional group for bonding to the first layer, and a removable organic group e.g. that can be removed on exposing the monolayer to an energy beam. In embodiments, the compound may comprise one or more removable organic groups. In embodiments, the compound may be an organotin, wherein the tin atom is the functional group and any organic substituent bonded to the tin atom may be one of the one or more removable organic groups. The one or more removable organic groups may be the same or may be different. They are typically the same. Each organic substituent may independently be an alkyl group, such as an alkyl chain, comprising 1 to 10 carbon atoms, 2 to 6 carbon atoms, or 3 to 5 carbon atoms. Each alkyl group may be halogenated, that is, the alkyl group may be substituted with at least one of the following atoms: fluorine, chlorine, bromine, and iodine. The alkyl group is generally terminated with a methyl group. For instance, the organotin comprised in the monolayer may be obtained by reacting a tetraalkyltin, e.g. tetrabutyltin, with the first layer. The tetraalkyltin may have four alkyl chains as defined above, i.e. comprising 1 to 10 carbon atoms, 2 to 6 carbon atoms, or 3 to 5 carbon atoms. Each alkyl group may be halogenated, that is, the alkyl group may be substituted with at least one of the following atoms: fluorine, chlorine, bromine, and iodine. The alkyl group is generally terminated with a methyl group.

In embodiments, the compound may be a silane i.e. an organosilicon compound. The silane comprised in the monolayer may be obtained by reacting the first layer with a compound comprising silicon and four substituents on silicon, wherein at least one substituent comprises an organic group, wherein generally at least two substituents comprise an organic group, wherein even more typically at least three substituents comprise an organic group, such as wherein all four substituents comprise an organic group. The organic group is generally terminated with a methyl group. The organic group may comprise an alkyl group, such as an alkyl chain, wherein the alkyl group is the removable group. The alkyl group may comprise an aromatic ring. The alkyl group comprises typically 1 to 18 carbon atoms. The alkyl group may be halogenated, that is, the alkyl group may be substituted with at least one of the following atoms: fluorine, chlorine, bromine, and iodine. The organic group may be an alkoxy group, such as a methoxy group and/or an ethoxy group. The silane may comprise from one to three alkoxy groups, more generally two or three alkoxy groups, such as three alkoxy groups, wherein one or more of these alkoxy groups form the functional group by reacting with the first layer. For example, the compound comprised in the monolayer may be formed by reacting an alkyltrimethoxysilane with the first layer, wherein three organic groups are a methoxy group, and wherein the fourth organic group comprises an alkyl group comprising 1 to 18 carbon atoms. One of the methoxy group typically serves as a functional group for bonding with the substrate.

In embodiments, the compound comprised in the monolayer may be obtained by reacting N,N-dimethyltrimethylsilylamine (TMS-DMA) with the first layer, wherein the dimethylsilylamine-group will react with the first layer, and the methyl substituents bonded to the silicon are the removable organic group. In particular, the decomposition of organotin compounds is very sensitive to EUV. The monolayer can be a self-assembled monolayer formed from the compound in the liquid or gas phase, wherein the formation of the monolayer is performed at a temperature below 200° C. i.e. to prevent decomposition of the compound. The functional group for binding to the first layer of the compound binds with the first layer to form a covalent bond between the functional group and the first layer, resulting in self-limited chemisorption of the compound to the first layer. The reaction is generally self-limiting such that a monolayer is formed i.e. having a thickness of 1 nm to 2 nm.

A monolayer is used instead of a thick layer to prevent cross-linking in a step (c) when the energy beam is applied. A thick layer instead of the monolayer could result in cross-linking of the material. Cross-linking of the material makes the layer difficult to remove e.g. via etching. Therefore, a monolayer is deposited.

The energy beam can be an EUV beam, an X-Ray beam, an electron beam, or an ion beam. The energy beam is generally an EUV beam comprising photons with a wavelength of 12 nm to 16 nm, for example 13.5 nm, i.e. having an energy of 92.5 eV. In the case where the energy beam is an EUV beam, the energy density is for instance below 100 $mJ/cm^2$, such as 50 $mJ/cm^2$ to 100 $mJ/cm^2$, even less than 50 $mJ/cm^2$. The energy beam is chosen such that it is absorbed by the compound comprised in the monolayer and capable of breaking the bond between the removable organic group and the functional group. In embodiments, the bond that is broken is for instance a tin-carbon bond in the case the monolayer comprises an organotin, or a silicon-carbon bond in the case the monolayer comprises a silane. After breaking of the bond, only the functional group remains on the first layer, covalently attached to the first layer, whereas generally the organic group evaporates and is removed from top of the first layer.

In embodiments of the present disclosure, the monolayer is patterned by illuminating only the second area and not the first area of the monolayer, for instance by using an optical mask to block a part of the beam or by using a finite energy beam width. As a result, only in the second area, decomposition of the compound in the monolayer will occur, thereby substantially removing the organic chains in the second area, whereas in the first area, the compound in the monolayer comprises the organic chains.

The monolayer forms a pattern corresponding to the pattern-wise exposure of the top surface. In embodiments, when the first area is formed of repetitive substantially identical features and wherein the second area is formed of repetitive substantially identical features, the smaller lateral dimensions of the features of the first area and the second area may defined by a half-pitch, i.e. half the distance between identical equally spaced features, that is at least 5 nm, such as 7 nm to 25 nm. In embodiments, the second area may comprise features in which the smaller lateral dimension is 5 nm to 40 nm, e.g. 7 nm to 25 nm. In embodiments, the first area may comprise features in which the smaller lateral dimension is 5 nm to 40 nm, e.g. 7 nm to 25 nm.

In embodiments, the substrate comprises a sensitizer layer as its top layer. The sensitizer layer is typically the layer directly below the first layer. The function of the sensitizer layer is to provide further sensitivity to the decomposition of the monolayer towards the energy beam. Without being bound by theory, upon the absorption of the energy beam by the sensitizer layer, the sensitizer layer forms secondary electrons that are relatively free to move through the material. Some of the secondary electrons diffuse through the first layer and into the monolayer, where they are capable of breaking the bond between the removable organic group and the functional group. This breaking of the bonds by the secondary electrons is typically in addition to the breaking of the bonds directly by the application of the energy beam. The use of the sensitizer layer is potentially useful in the case of a monolayer comprising a compound that is not very sensitive towards breaking of the bonds directly by the energy beam. In particular, in the case the monolayer comprises a silane, the use of a sensitizer layer is typical.

The sensitizer layer comprises a material that is capable of forming secondary electrons on absorption of energy from the energy beam. For instance, the sensitizer layer in embodiments comprises tin, a binary compound comprising tin, such as a tin oxide, a tin nitride, or a tin iodide, tellurium, or a binary compound comprising tellurium, such as a tellurium oxide, a tellurium nitride, or a tellurium iodide. Alternatively, the sensitizer layer may comprise iodine or a binary compound comprising iodine. In embodiments, the sensitizer layer may comprise one of the following ternary compounds: a ternary compound of tin, a ternary compound of tellurium, or a ternary compound of iodine. Ternary compounds may potentially form smooth amorphous films. The sensitizer layer may be formed using atomic layer deposition, chemical vapor deposition, or physical layer deposition. Generally, the sensitizer layer is deposited using physical layer deposition.

Because the secondary electrons should be able to diffuse through the first layer before reaching the first layer, in embodiments wherein the substrate comprises a sensitizer layer as its top layer, the thickness of the first layer is usually limited, and is therefore typically smaller than 3 nm, for example 1 nm to 2 nm. The sensitizer layer is generally thick enough so that enough secondary electrons are formed that diffuse towards the monolayer. On the other hand, the sensitizer layer should not be very thick as the material it comprises is typically difficult to etch through. In embodiments, the thickness of the sensitizer layer is at least 3 nm, for example from 3 nm to 5 nm.

In embodiments of the present disclosure, the substrate comprises an organic mask layer over the layer to be patterned. In the case a sensitizer layer is comprised in the substrate, the sensitizer can be the highest layer of the substrate i.e. as close to the monolayer as possible, hence the organic mask layer is generally below the sensitizer layer. The thickness of the organic mask layer is typically 10 nm to 100 nm. In embodiments, the organic mask layer may act as the mask for selectively etching the layer to be patterned: therefore, it needs to be suitable to allow selective etching of the layer to be patterned with respect to the organic mask layer. The material for the organic mask layer therefore depends on the material of the layer to be patterned. Examples of the organic mask are carbon films which are deposited via spin-coating, and amorphous carbon films deposited via chemical vapor deposition, plasma-enhanced chemical vapor deposition, physical vapor deposition, or atomic layer deposition.

After a first area and a second area are formed using an energy beam, the method comprises selectively depositing an amorphous carbon layer on top of the first area. The amorphous carbon layer may for instance be deposited from a plasma comprising a hydrocarbon compound, and an inert gas such as Ar, He, $N_2$, $H_2$, $NH_3$, CO, $CO_2$, and combinations thereof. Suitable hydrocarbon compounds include one or more of the following compounds, for example, alkynes such as acetylene ($C_2H_2$), propylene ($C_3H_6$), propyne ($C_3H_4$), propane ($C_3H_8$), butane ($C_4H_{10}$), butylene ($C_4H_8$), butadiene ($C_4H_6$), vinylacetylene and derivatives thereof, aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like. Additional suitable hydrocarbons include alkenes such as ethylene, propylene, butylene, pentene, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like.

A possible temperature range for the deposition of the amorphous carbon layer is 20° C. to 200° C. Without being bound by theory, under the plasma conditions, a polymerization type of reaction is promoted on the first area comprising the monolayer compound comprising organic chains, wherein the polymerization type of reaction comprises a reaction between the hydrocarbon in the plasma and the organic chains of the compound in the monolayer, which results in isotropic growth of an amorphous carbon layer on top of the first area. The thickness of the amorphous carbon layer is generally from 2 nm to 10 nm.

In some embodiments of the present disclosure, the method comprises step (e) after step (d), of (e) replicating the pattern into any layer present between the pattern and the layer to be patterned, by etching through the layer, selectively with respect to the amorphous carbon layer. As such, the amorphous carbon layer acts as a thin mask for the etching. For instance, a dry etching technique can be used such as capacitively coupled plasma etch or inductively coupled plasma etch. In these techniques, the plasma comprises for example $CF_4$, $H_2$, $CH_4$, $CHF_3$, $CH_2F_2$ or $CH_2F_2$, but is not limited thereto, and wherein the carrier gas comprises an inert gas, generally Ar. In particular, if the plasma comprises $H_2$, $CH_4$, $CHF_3$, $CH_2F_2$ or $CH_2F_2$, the selectivity of the etch may be improved, as they promote further polymerization of the amorphous carbon layer, thereby further improving its resistivity against etching. In embodiments, additionally, pulsed plasma etching or atomic-layer etching techniques may be used. They are potentially beneficial because they tend to further enhance the selectivity of the dry patterning process. The method comprising step (e) is effectively a positive tone pattern etching method, as etching selectively occurs in the second area that was exposed to the energy beam.

In embodiments of the first aspect, the present disclosure relates to a method comprising steps (f), (g), and (h) after step (d), of (f) halogenating the amorphous carbon layer, thereby forming a halogenated amorphous carbon layer, (g) selectively depositing an inorganic mask layer on top of the second area, thereby forming an inorganic pattern, and (h) replicating the inorganic pattern into any layer present between the inorganic pattern and the layer to be patterned, by etching through the layer, selectively with respect to the inorganic pattern.

Step (f) of halogenating the amorphous carbon layer could for instance be performed by exposing the amorphous carbon layer to a plasma comprising a halogen-comprising compound such as $Cl_2$, $CF_4$, HBr, $CBr_4$, $CF_3I$, $CF_2I_2$, $C_2F_3I$, or $C_3F_7IH_2I_2$. In embodiments, the temperature in this step generally does not exceed 250° C., in particular in the case of bromination and/or iodination, to prevent decomposition of the halogen-comprising compound. The halogenated amorphous carbon layer formed in this way generally acts as a growth blocking layer i.e. against the deposition of the inorganic mask layer in step (g). As a result, in step (g), area selective deposition of the inorganic mask layer occurs substantially only on the second area not comprising the halogenated amorphous carbon layer.

In embodiments, the inorganic mask layer may comprise one or more of a metal, such as ruthenium or tungsten, a metal oxide, such as $TiO_2$ or $Al_2O_3$, and a metal nitride, such as TiN. In embodiments, the inorganic mask layer may have a thickness of 2 nm to 10 nm. The inorganic mask layer is selectively deposited for instance via atomic layer deposition (ALD) or via chemical vapor deposition (CVD), typically at a temperature of 50° C. to 350° C. In embodiments, a cyclical deposition technique is used, such as by performing multiple cycles of an ALD technique. Precursors of the metal, metal oxide or metal nitride that can be used are for instance metal halides or alkoxides.

Without being bound by theory, the area selective formation in step (g) is believed to be typically achieved by a difference in nucleation rate of the precursor of the metal, metal oxide or metal nitride between the first and second area. As such, forming the metal oxide or metal nitride in step (g) may comprise using at least one precursor (and typically only precursors) which results in poor nucleation on the second surface (e.g. at least two times slower, at least five times slower, or at least ten times slower, as compared to the first surface).

The inorganic mask layer deposited on the second area acts as a mask against the selective etching performed in step (h), i.e. which occurs selectively with respect to the inorganic mask layer. The etching of step (h) typically comprises a single etching step. However, the etching of step (h) may comprise multiple etching steps, as a single step may not have the required selectivity with respect to the inorganic mask layer for each of the organic and/or inorganic layers comprised in the patterning mask. Generally, the inorganic mask layer is not consumed before the pattern is transferred into the organic mask layer. Firstly, the multiple etching steps may for instance comprise a selective etching step comprising a plasma comprising an oxidizing agent, such as $O_2$ or $CO_2$, or a reducing agent, such as $H_2$ possibly with $N_2$ as carrier gas, i.e. to etch through the halogenated amorphous carbon layer. Secondly, the multiple etching steps, for instance, may comprise a selective etching step comprising a plasma comprising a fluorocarbon such as $CF_4$ or $CHF_3$ with argon as a carrier gas, or $CHF_3$ with Ar and $N_2$ as a carrier gas, i.e. to etch through the monolayer and, in embodiments wherein the substrate comprises the sensitizer layer, the sensitizer layer. Alternatively, in embodiments wherein the substrate comprises the sensitizer layer, the sensitizer layer may be etched in the absence of a halogen. Thirdly, the pattern may be etched into the organic mask layer using a selective etching step comprising a plasma comprising an oxidizing agent, such as $O_2$ or $CO_2$, or a reducing agent, such as $H_2$ possibly with $N_2$ as a carrier gas. The selectivity of the etch process can be additionally enhanced by employing pulsed plasma and atomic layer etch techniques. The method comprising steps (f), (g), and (h) is effectively a negative tone pattern etching method, as etching selectively occurs in the first area that was not exposed to the energy beam.

In embodiments, the patterning mask comprises the first layer, the monolayer on top of the first layer, wherein the monolayer comprises the first and the second area, and the amorphous carbon layer on top of the first area of the monolayer. In embodiments, the amorphous carbon layer comprised in the patterning mask is halogenated, i.e. the patterning mask comprises the halogenated amorphous carbon layer on top of the first area of the monolayer instead of the amorphous carbon layer on top of the first area of the monolayer. In embodiments wherein the patterning mask comprises the halogenated amorphous carbon layer on top of the first area, the patterning mask may comprise the inorganic mask layer on top of the second area. In embodiments, the patterning mask also comprises the sensitizer layer, wherein the first layer is on top of the sensitizer layer. In embodiments, the patterning mask comprises the organic mask layer and the sensitizer layer, wherein the sensitizer layer is on top of the organic mask layer. In embodiments, the patterning mask comprises the organic mask layer but no sensitizer layer, wherein the first layer is on top of the organic mask layer. In embodiments, at least one of the layers of the patterning mask is patterned with the pattern, generally the monolayer. In embodiments, multiple layers comprised in the patterning mask are patterned with the pattern. In embodiments, all layers of the patterning mask are patterned with the pattern.

In a second aspect, the present disclosure relates to a method for patterning a layer, the method comprising performing a method according to certain embodiments of the first aspect, and replicating the pattern of the layer on top of the layer to be patterned into the layer to be patterned. This requires an etching technique that selectively etches the layer to be patterned with respect to any of the layers present on the layer to be patterned, typically with respect to the organic mask layer. For example, the layer to be patterned may generally be any layer for which a sufficient etch selectivity with respect to the organic mask layer can be achieved i.e. so that the organic mask layer can function as a patterning mask for the layer to be patterned.

In a third aspect, the present disclosure is related to a structure comprising (i) a substrate comprising a layer to be patterned, (ii) a first layer over the substrate, (iii) a monolayer bonded to the first layer, the monolayer comprising a compound, the first layer comprising a pattern comprising a first and a second area, the first area comprising the compound comprising an organic group and the second area comprising the compound not comprising the organic group, and (iv) an amorphous carbon layer on top of the first area of the monolayer.

The different layers of a structure according to the third aspect may comprise the same materials as equivalent layers disclosed in the method of the first aspect.

The first layer comprises at least one oxide, for example selected from silicon oxide, tin oxide, zirconium oxide, and titanium oxide. In embodiments, the first layer has a thickness of up to 10 nm.

The monolayer comprises a compound comprising a functional group that is covalently bound to the first layer. In the second area, the monolayer comprises the compound, which may be a compound of the monolayer as defined in the first aspect, however wherein the compound does not comprise an organic group. In the first area, the compound may be a compound of the monolayer as defined in the first aspect, i.e. wherein the compound comprises an organic group that, in embodiments, is covalently bound to the amorphous carbon layer on top of the first area. The amorphous carbon layer is polymerized carbon that is covalently bound to the organic group of the compound of the monolayer on the first area. The thickness of the amorphous carbon layer is generally 2 nm to 10 nm. The monolayer may comprise, in embodiments, a single layer of the compound that has a thickness of 1 nm to 2 nm.

The layer to be patterned is not particularly limited and may generally be any layer for which a sufficient etch selectivity with respect to a mask used in this method can be achieved (i.e. so that the mask can function as a patterning mask for the layer to be patterned). In embodiments, the layer to be patterned may be an intermediate structure in the manufacture of a semiconductor device, such as a semiconductor substrate or a semiconductor structure.

In embodiments, the substrate comprises an organic mask layer over the layer to be patterned. The thickness of the organic mask layer is typically 10 nm to 100 nm. The organic mask layer can in embodiments act as the mask for selectively etching the layer to be patterned. The material for the organic mask layer, therefore, depends on the material of the layer to be patterned. In embodiments, the organic mask layer comprises carbon films and/or amorphous carbon films.

In certain embodiments, the amorphous carbon layer comprises halogen. In these embodiments, there is in addition an inorganic mask layer on top of the second area. In embodiments, the inorganic mask layer generally has a thickness of 2 nm to 10 nm. The inorganic mask may comprise any material as mentioned in the first aspect with respect to this layer. The inorganic mask layer acts as a mask against selective etching occurring selectively with respect to the inorganic mask layer. In this way, the layers on top of the layer to be etched can be etched selectively. These embodiments of the structure of the third aspect of the disclosure, i.e. comprising an amorphous carbon layer comprising halogen, can be used in particular for a negative tone pattern etching method.

In embodiments, the substrate may comprise a sensitizer layer that is the top layer of the substrate, and the thickness of the first layer is smaller than 3 nm, typically 1 nm to 2 nm. In embodiments wherein a sensitizer layer is present, the sensitizer layer is the highest layer of the substrate. The sensitizer layer in embodiments may comprise any material as mentioned in the first aspect with respect to this layer. In embodiments, the thickness of the sensitizer layer is at least 3 nm, generally 3 nm to 5 nm.

In embodiments, all layers above the layer to be patterned are patterned with the same pattern. These embodiments are particularly well suited for use in the method according to the second aspect of the present disclosure.

A detailed description of several embodiments of the disclosure follows. It is clear that other embodiments of the disclosure can be configured according to the knowledge of persons skilled in the art without departing from the true spirit or technical teaching of the disclosure, the disclosure being limited only by the terms of the appended claims.

Example 1: Formation of a Patterning Mask, Applying Positive Tone Etching

In FIG. 1 panel A, a 10 nm to 100 nm organic mask layer (11) is deposited on the layer to be patterned (10), e.g. via spin-coating, chemical vapor deposition, plasma-enhanced chemical vapor deposition, physical vapor deposition, or atomic layer deposition. Next, a first layer (12) typically having a thickness less than 10 nm, is deposited on the organic mask layer (11), e.g. using atomic layer deposition, chemical vapor deposition, or physical vapor deposition. Next, a monolayer (13), comprising an organotin comprising a removable organic group, is grown on the first layer (12), e.g. wherein the organotin is deposited from a solvent or from the gas phase, at a temperature that is low enough to prevent decomposition of the organotin i.e. below 200° C. The tin is a functional group that covalently binds to the first layer.

In FIG. 1 panel B, the monolayer (13) is exposed to an energy beam such as an EUV beam (14) generally having a wavelength of 12 nm to 16 nm, thereby forming a pattern comprising a first area comprising the organotin (130) i.e. comprising the removable organic group, and a second area comprising the tin (131) i.e. not comprising the removable organic group.

In FIG. 1 panel C the monolayer is exposed to a plasma comprising a hydrocarbon, thereby forming an amorphous carbon layer (15) on top of the first area of the monolayer (130) but not on the second area of the monolayer (131).

Referring to FIG. 1 panel D, by applying a dry etching technique such as capacitively coupled plasma etch or inductively coupled plasma etch, the pattern is replicated in all layers present between the pattern and the layer to be patterned (10), selectively with respect to the amorphous carbon layer (15).

The obtained structure can then be used (not depicted) as a patterning mask for the underlying layer to be patterned.

Example 2: Formation of a Patterning Mask, Using a Sensitizer Layer, and Applying Negative Tone Etching Referring to FIG. 2 panel A, firstly, a 10 nm to 100 nm organic mask layer (11) is deposited on the layer to be patterned (10), e.g. via spin-coating, chemical vapor deposition, plasma-enhanced chemical vapor deposition, physical vapor deposition or atomic layer deposition. Secondly, a sensitizer layer (28), having a thickness of at least 3 nm, typically 3 nm to 5 nm, is deposited on the organic mask layer (11), using a technique such as atomic layer deposition, chemical vapor deposition, or physical layer deposition. Thirdly, a first layer (12), having a thickness less than 3 nm, generally of 1 nm to 2 nm, is deposited on the sensitizer layer (28), e.g. using atomic layer deposition, chemical vapor deposition, or physical vapor deposition. Fourthly, a monolayer (13), comprising a compound comprising a functional group to bind to the first layer (12) and a removable organic group, wherein the compound is an organotin or a silane, is bonded to the first layer (12), e.g. from a solution or from gas comprising the compound, at a temperature that is low enough to prevent decomposition of the compound i.e. below 200° C.

Figure 2:
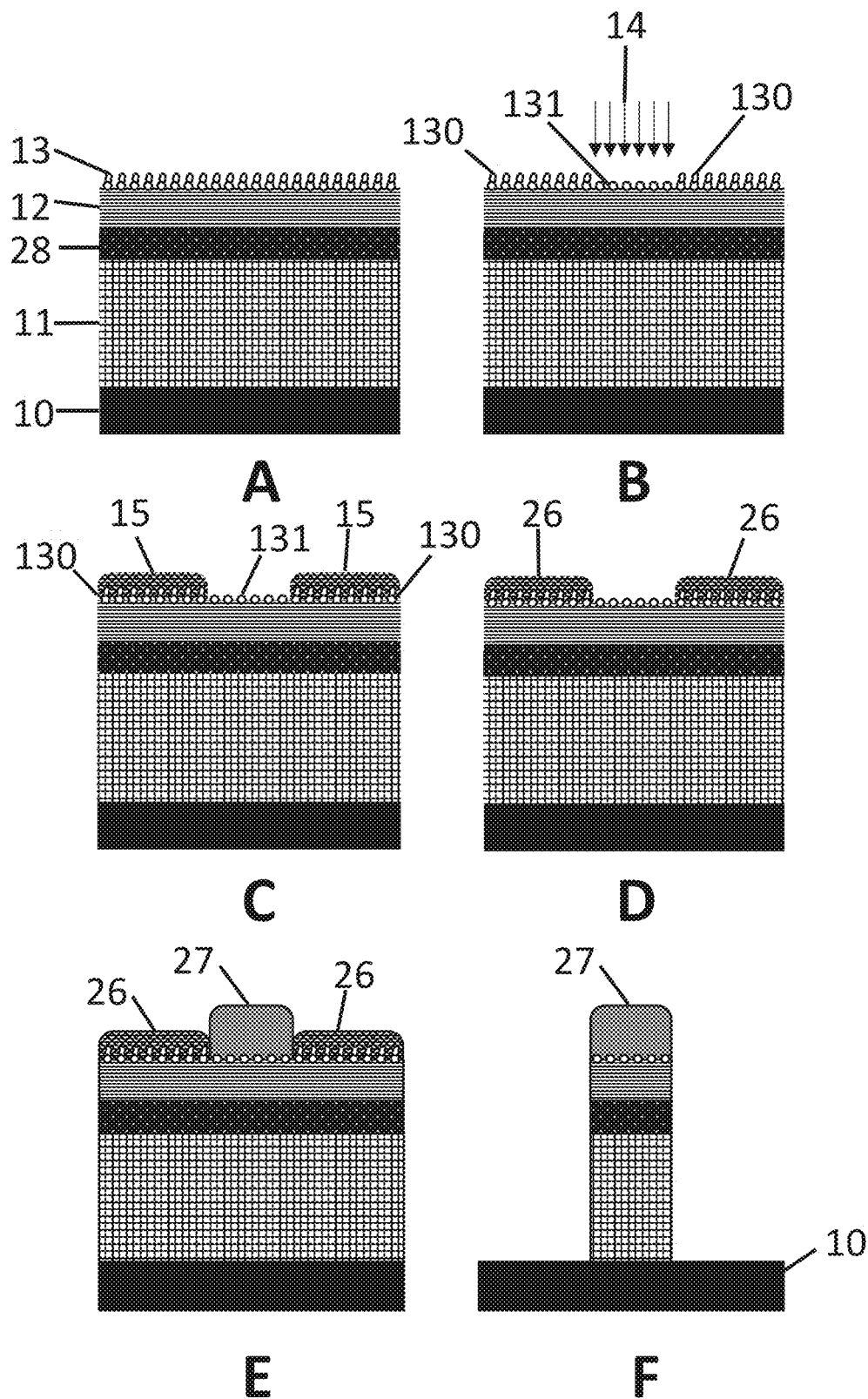
FIG. 2 is a schematic representation of steps of a method, according to an embodiment.

Referring to FIG. 2 panel B, the monolayer is exposed to an energy beam such as an EUV beam (14) typically having a wavelength of 12 nm to 16 nm, thereby forming a pattern comprising a first area comprising the compound comprising the removable organic group (130), and a second area comprising the compound not having the removable organic group (131).

Referring to FIG. 2 panel C, the monolayer is exposed to a plasma comprising a hydrocarbon, thereby forming an amorphous carbon layer (15) with a thickness of 2 nm to 10 nm on top of the first area of the monolayer (130) but not on the second area (131).

Referring to FIG. 2 panel D, the amorphous carbon layer is exposed to a plasma comprising a halogen, thereby forming a halogenated amorphous carbon layer (26).

Referring to FIG. 2 panel E, an inorganic mask layer (27) is selectively formed on the second area (131) via atomic layer deposition or via chemical vapor deposition, selectively with respect to the halogenated amorphous carbon layer (26). The inorganic mask layer (27) comprises a metal, a metal oxide or a metal nitride and has a thickness of 2 nm to 10 nm.

Referring to FIG. 2 panel F, by applying multiple etching steps, the pattern is replicated in all layers present between the pattern and the layer to be patterned (10), selectively with respect to the inorganic mask layer (27). As an example for the multiple etching steps, firstly, a plasma etch may be applied wherein the plasma comprises an oxidizing agent, or a reducing agent, to etch through the halogenated amorphous carbon layer. Secondly, a selective etching step comprising a plasma comprising a fluorocarbon may be applied to etch through the monolayer and the sensitizer layer. Thirdly, a selective etching step comprising a plasma comprising an oxidizing agent a reducing agent may be applied to etch through the organic mask layer.

The obtained structure can then be used (not depicted) as a patterning mask for the underlying layer to be patterned.

In the examples 1 and 2, positive tone etching is applied to a structure not comprising a sensitizer layer, and negative tone etching is applied to a structure comprising a sensitizer layer. The tone of the etching is however in no way restricted by the absence or presence of a sensitizer layer. Hence, in other embodiments of the present disclosure, negative tone etching can be applied to a structure not comprising a sensitizer layer, and positive tone etching can be applied on a structure comprising a sensitizer layer.

It is to be understood that although embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a patterning mask over a layer to be patterned, the method comprising:
   providing a first layer over a substrate, the substrate comprising the layer to be patterned;
   bonding a functional group of a monolayer to the first layer, the monolayer further including a removable organic group;
   exposing the monolayer to an energy beam, thereby forming a pattern of a first area that includes the removable organic group and a second area that does not include the removable organic group; and
   selectively depositing an amorphous carbon layer on the first area.

2. The method according to claim 1, wherein the monolayer comprises an organotin.

3. The method of claim 1, wherein the substrate comprises a sensitizer layer as a top layer of the substrate.

4. The method according to claim 3, wherein a thickness of the sensitizer layer is at least 3 nm.

5. The method of claim 3, wherein a thickness of the sensitizer layer is 3 nm to 5 nm.

6. The method according to claim 3, wherein the sensitizer layer comprises one or more of tin, a binary compound comprising tin, tellurium, or a binary compound comprising tellurium.

7. The method according to claim 1, wherein a thickness of the first layer is less than 3 nm.

8. The method of claim 1, wherein a thickness of the first layer is 1 nm to 2 nm.

9. The method according to claim 1, wherein the substrate comprises an organic mask layer over the layer to be patterned.

10. The method according to claim 1, wherein the first layer comprises at least one metal oxide, selected from silicon oxide, tin oxide, zirconium oxide, and titanium oxide.

11. The method according to claim 1, comprising replicating the pattern into an intermediate layer present between the pattern and the layer to be patterned, by etching through the intermediate layer selectively with respect to the amorphous carbon layer.

12. The method according to claim 1, further comprising:
    halogenating the amorphous carbon layer;
    selectively depositing an inorganic mask layer on top of the second area, thereby forming an inorganic pattern; and
    replicating the inorganic pattern into an intermediate layer between the inorganic pattern and the layer to be patterned, by etching through the intermediate layer selectively with respect to the inorganic pattern.

13. The method according to claim 12, wherein the inorganic mask layer comprises one or more of a metal, a metal oxide, or a metal nitride.

\* \* \* \* \*